United States Patent [19]

Zejda

[11] Patent Number: 5,228,968
[45] Date of Patent: Jul. 20, 1993

[54] CATHODE SPUTTERING SYSTEM WITH AXIAL GAS DISTRIBUTION

[75] Inventor: Jaroslav Zejda, Rodenbach, Fed. Rep. of Germany

[73] Assignee: Leybold Aktiengesellschaft, Hanau, Fed. Rep. of Germany

[21] Appl. No.: 862,071

[22] Filed: Apr. 2, 1992

[30] Foreign Application Priority Data

Dec. 11, 1991 [DE] Fed. Rep. of Germany ....... 4140862

[51] Int. Cl.$^5$ ............................................. C23C 14/34
[52] U.S. Cl. ........................... 204/298.07; 204/192.12; 204/298.11
[58] Field of Search .................... 204/192.12, 298.07, 204/298.11, 298.19, 298.26

[56] References Cited

U.S. PATENT DOCUMENTS

| 4,006,070 | 2/1977 | King et al. | 204/298.07 X |
| 4,183,197 | 1/1980 | Kennedy et al. | 204/192 |
| 4,412,906 | 11/1983 | Sato et al. | 204/298.07 |
| 4,558,388 | 12/1985 | Graves, Jr. | 204/298.15 X |
| 4,572,842 | 2/1986 | Dietrich et al. | 204/298.07 X |
| 4,715,319 | 12/1987 | Bringmann et al. | 204/298.07 X |
| 4,871,434 | 10/1989 | Munz et al. | 204/298.07 X |
| 4,931,169 | 6/1990 | Scherer et al. | 204/298.11 |
| 4,946,576 | 8/1990 | Dietrich et al. | 204/298.07 X |
| 4,988,422 | 1/1991 | Wirz | 204/298.07 X |

FOREIGN PATENT DOCUMENTS

| 0303061 | 12/1988 | Japan | 204/298.07 |
| 3010072 | 1/1991 | Japan | 204/298.07 |

Primary Examiner—Nam X. Nguyen
Attorney, Agent, or Firm—Felfe & Lynch

[57] ABSTRACT

A gas inlet (3), a substrate holder (10) with a substrate (11) and a gas outlet (5) are located on a common axis (4) in the vacuum casing (I) of a cathode sputtering system. This results in a symmetrical flow inside the cathode station (2) and a concentric uniformity of the gas pressure. These conditions result in a particularly even coating of the substrate (11) by means of sputtering.

12 Claims, 4 Drawing Sheets

CATHODE SPUTTERING SYSTEM WITH AXIAL GAS DISTRIBUTION

BACKGROUND OF THE INVENTION

The invention relates to a cathode sputtering system with at least one cathode station, which is encased by an outer shell and designed as a vacuum chamber and has at least one cathode with a target. A substrate holder is located in this cathode station in order to hold a substrate that is to be coated, such as for instance a data storage diskette, and this cathode station has at least one gas inlet and at least one gas outlet that is to be connected to a vacuum pump.

A cathode sputtering system of this type is described in U.S. Pat. No. 4,558,388, which is incorporated herein by reference. In the case of this system, a substrate is being held in the center of the cathode station on an axis, and a cathode with a target is located on either side of the substrate in order to coat both sides of the substrate simultaneously by means of a sputtering process. In order to produce the required vacuum, a gas outlet is provided in the outer casing of the cathode station in a direction perpendicular to the axis. This gas outlet runs through the cathode and is connected to a vacuum pump. The gas inlet is located above the cathode on one front side of the outer casing. Usually substrates have to be coated extremely evenly. When dealing with data storage disks, the thickness of the aluminum layer applied must for instance be less than one ten-thousandth of a millimeter. An uneven coating would lead to a decrease in storage locations for the digital information that needs to be stored.

In order to achieve the desired evenness in the coating, measures were primarily taken in the case of known cathode sputtering systems to ensure that the substrate is oriented exactly toward the cathode and the target and that the physical conditions influencing the progression of the sputtering process are optimized and kept as constant as possible.

SUMMARY OF THE INVENTION

The object of the invention is to increase the evenness of the coating of the substrate even further when compared to known cathode sputtering systems.

The gas inlet, the substrate holder and the gas outlet are located on one common axis or that several gas inlets and/or gas outlets are located symmetrically to the axis of the substrate holder.

This design results in a very even pressure of process gas in the cathode station. In any case one has ensured that the pressures at equal distances from the substrate are absolutely identical. This concentric uniformity of pressure in combination with the overall considerable uniformity in pressure leads to particular uniformity as the sputtering process progresses and therefore to an even coating of the substrate. The cathode sputtering system as outlined in the invention is therefore particularly suitable for the coating of compact disks, magnetic disks and opto-magnetic disks. When substrates are to be coated on both sides at the same time, a cathode with a target can be provided on either side of the substrate holder in the cathode station as a beneficial further development of the invention.

The large gas flow surface area required to allow for the quick suction of the cathode station and an even supply of gas can easily be achieved by the fact that a ring-shaped flow channel is formed between the outer masking of the cathode and the outer casing. This flow channel is directed to the substrate which is held by the substrate holder.

The supply of gas is automatically diverted by the outer masking toward the substrate if, in accordance with a very favourable further development of the invention, an inner flow channel is formed between the cathode and the cathode masking for the gas supply in the cathode station in addition to the flow channel on the outer side of the cathode masking.

The supply of gas streaming in optimally reaches the central area of the substrate and then distributes evenly toward the peripheral areas if, in accordance with another variation of the invention, a gas supply bore hole is provided that runs centrally through the cathode and through its target whose flow is connected with the gas inlet.

In the case of such a central gas supply one can also provide for large suction cross sections for the space behind the cathode by establishing a connection between the gas inlet, the gas supply bore hole and the ring-shaped flow channels. In order to further increase the evenness of the distribution of the gas supply it is beneficial if several gas outlets are provided on an axis parallel to the axis on a shared portion of a circle between the target and the substrate holder.

From a design standpoint, a gas supply by means of several gas outlets is particularly simple to realize if the gas outlets are located in a ring channel that runs coaxially to the axis.

The ring channel can be realized fairly easily without great expense if the gas outlets are provided on a ring channel located on the inner mantle surface of the outer masking, coaxially to the axis.

DETAILED DESCRIPTION OF THE PREFERRED EMBODIMENTS

Figure 1:
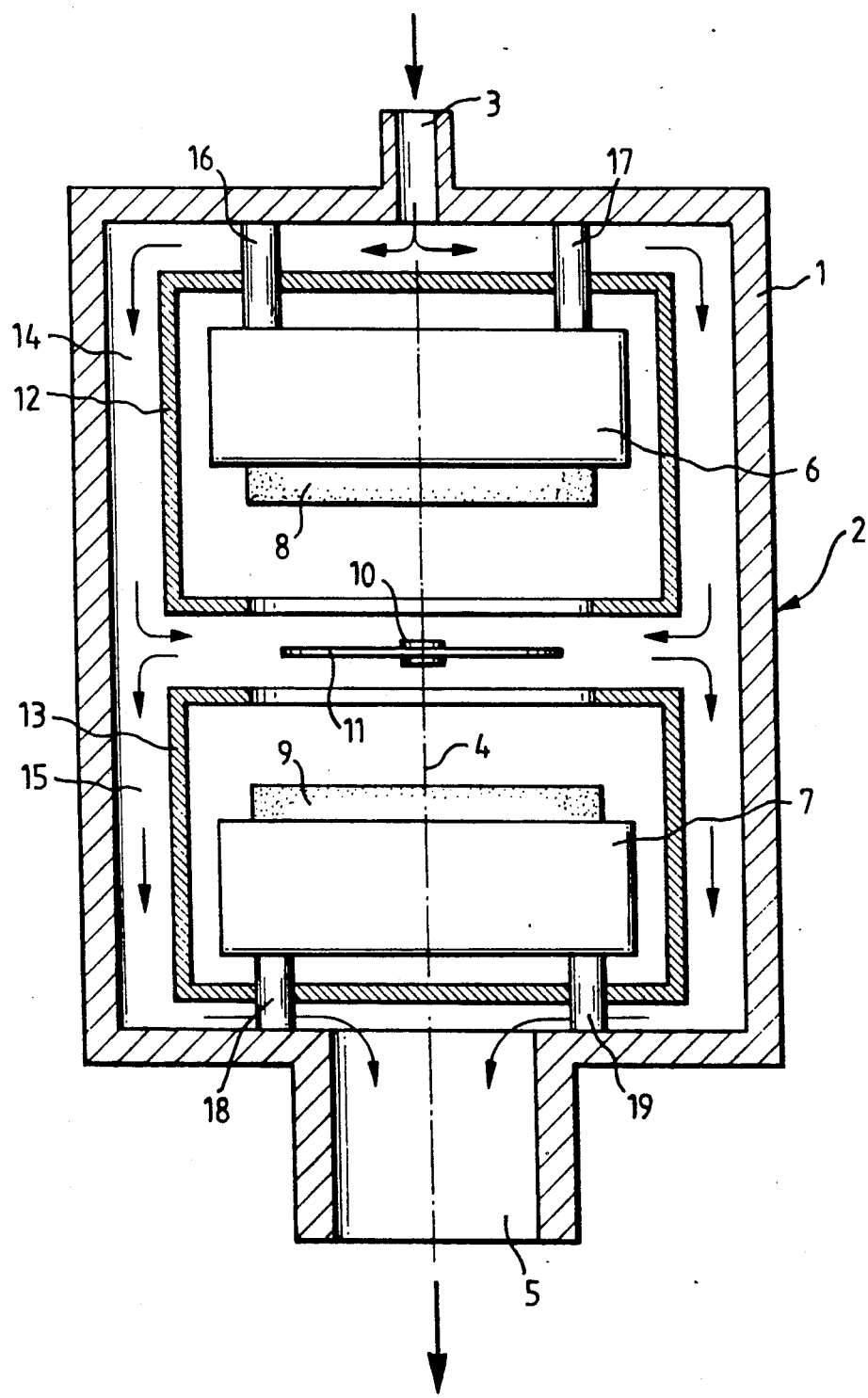
FIG. 1 is an axial section of a first embodiment of the cathode system.

FIG. 1 shows a cathode station 2 surrounded by an outer casing 1 which preferably has a circular cross-section between opposite ends. The outer casing 1 has a gas inlet 3 at one end and in true alignment to this inlet it has a gas outlet 5 on a joint axis 4 located at the opposite end. This gas outlet 5 has a substantially greater cross-section than gas inlet 3. This gas outlet 5 is to be connected with a vacuum pump that is not shown in the illustration.

In the interior of the cathode station 2 two cathodes 6, 7 with their respective targets 8, 9 are located coaxially to axis 4.

Between targets 8, 9 there is a substrate holder 10 located on axis 4 which is holding a substrate 11—in this case a data storage disk—that needs to be coated. Both cathodes 6, 7 with their respective targets 8, 9 are surrounded by an outer masking 12, 13.

The outer maskings 12, 13 each leave a clearance for an annular flow channel 14, 15 between their outer mantle surface and the outer casing 1. The cathodes 6, 7 are held at a distance from the outer casing 1 by means of insulators 16, 17, 18, 19. As a result of this, the gas flowing in through gas inlet 3 can flow on the paths marked by arrows past the outer side of the outer masking 12, 13 to the substrate 11 and then on a corresponding path to gas outlet 5.

Figure 2:
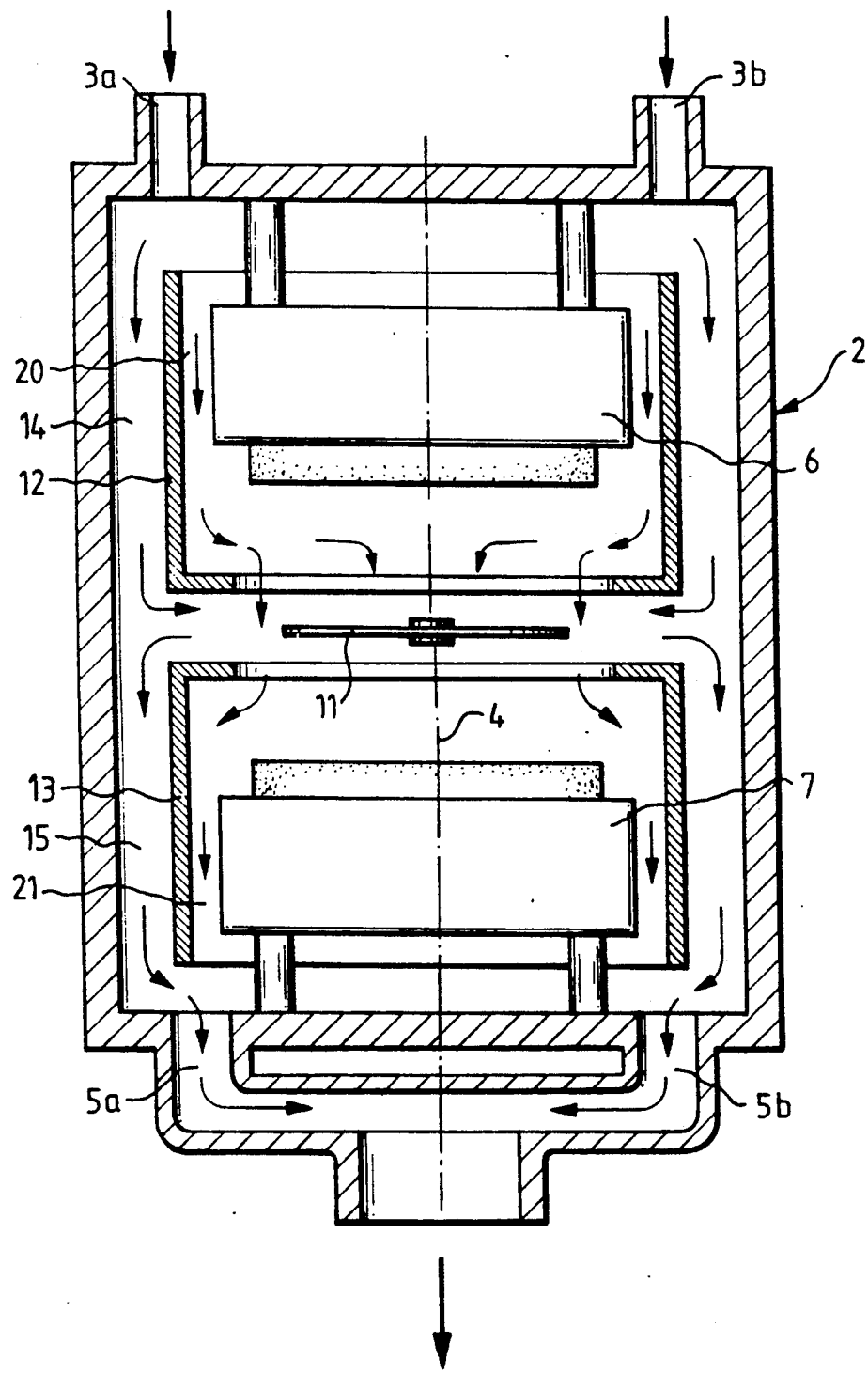
FIG. 2 is an axial section of an embodiment with a flow-through mask.

In the embodiment shown in FIG. 2 there are several gas inlets 3a, 3b in even distribution on a common portion of a circle that is located coaxially to axis 4, and correspondingly in the lower front area on a common portion of another circle there are several evenly distributed gas outlets 5a, 5b. Furthermore, in contrast to FIG. 1, in this variation of the invention the outer maskings 12, 13 do not cover the cathodes 6, 7 toward the gas inlets 3a, 3b or the gas outlets 5a, 5b respectively.

This creates annular inner flow channels 20, 21 that are respectively located between the cathode 6, 7 and the inner side of the outer masking 12, 13 in addition to the outer flow channels 14, 15. Through these additional flow channels, gas is able to flow symmetrically toward the center of the substrate 11. It should be noted that these inner flow channels 20, 21 have a more favorable effect if the cathode station 2 only has one gas inlet 3 and only one gas outlet 5 as shown in FIG. 1.

Figure 3:
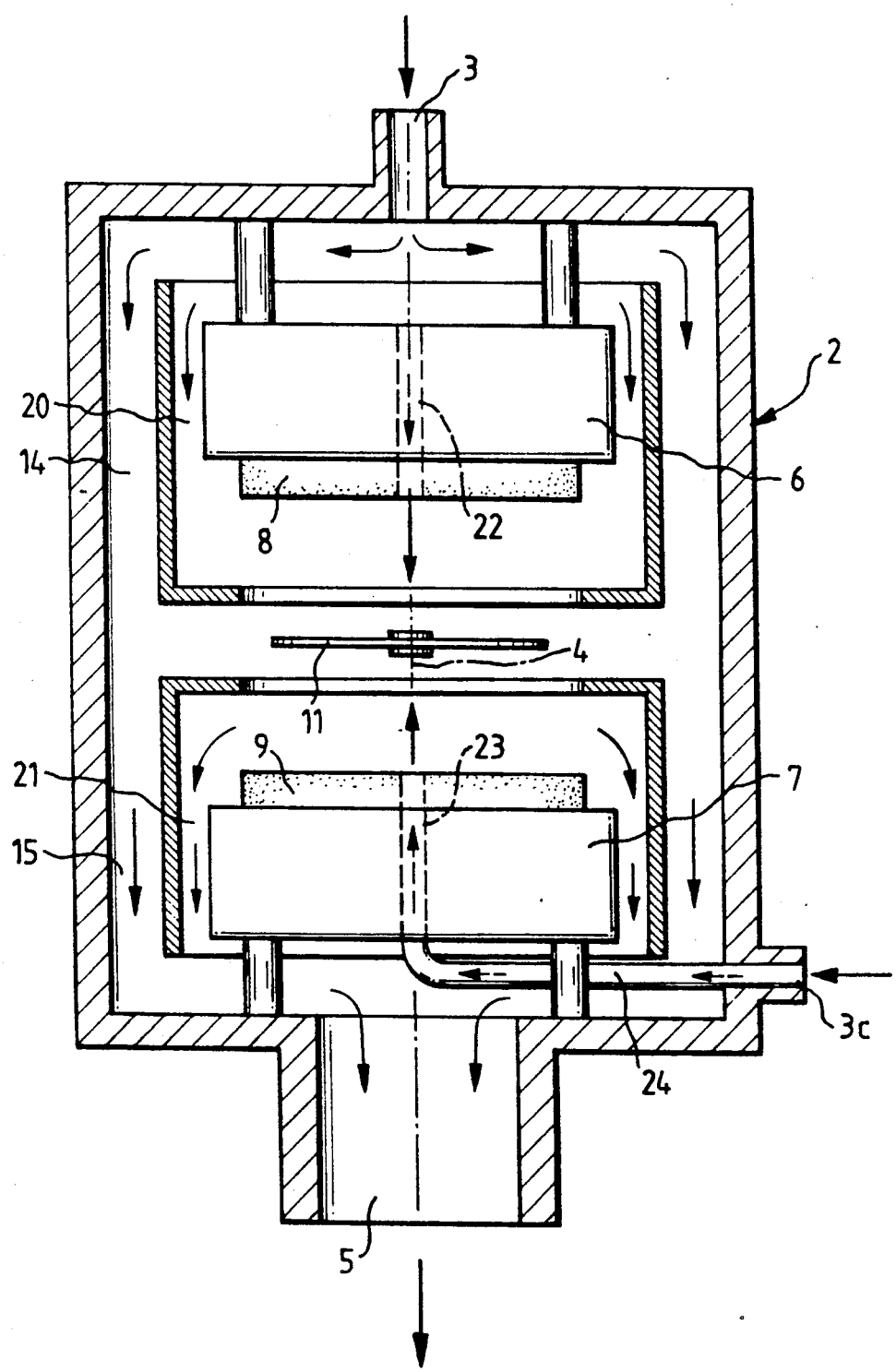
FIG. 3 is an axial section of an embodiment with gas supply through the target.

In the embodiment of FIG. 3 a respective gas supply boring 22, 23 is located coaxially through the cathodes 6, 7 and their respective targets. A partial flow of gas can move in a direct path from gas inlet 3 to one side of substrate 11. Gas flows from a second gas inlet 3c through a pipe 24 to the other side of substrate 11 via a gas supply borehole 23 through cathode 7 and target 9.

Figure 4:
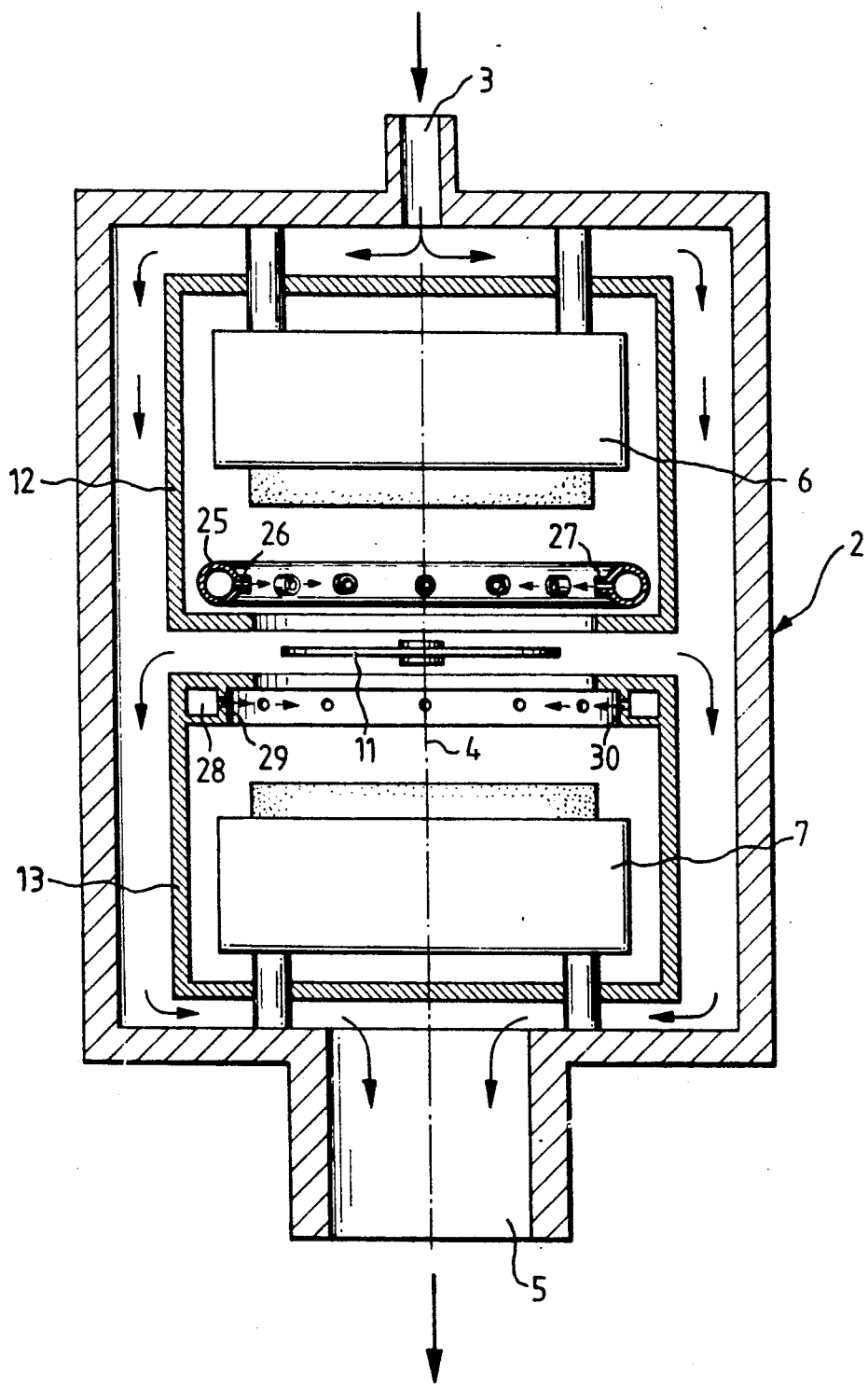
FIG. 4 is an axial section of an embodiment with a concentric manifold gas supply.

As FIG. 4 shows, a ring manifold 25 is located inside the outer masking 12 in the upper part of the cathode station 2. This manifold has gas outlets 26, 27 that are facing inward and that are distributed evenly through its circumference. As a result, gas flows to the substrate il from gas inlet 3 on one hand, on the other hand from gas outlets 26, 27.

In the lower part of FIG. 4 an alternative to manifold channel 25 is illustrated. This alternative encompasses the design of a manifold channel 28 on the inner mantle surface of the outer masking 13. This ring channel 28 also has radially located, inward-facing gas outlets 29, 30.

In conclusion it should be noted that the variations of the invention each show cathode sputtering systems with two opposite cathodes 6, 7 in the cathode station 2. If a substrate is to be coated only on one side, which could be the case for instance with magneto-optical data storage disks, one can provide only one cathode 6 in every cathode station when designing a cathode sputtering system in accordance with the invention, so that, as a result of omitting cathode 7, the cathode station is built in a more compact way.

I claim:

1. Cathode sputtering system comprising
   an outer casing which serves as vacuum chamber, said casing having opposed ends,
   substrate holding means between said ends and having a central axis through said ends,
   at least one cathode with an associated target located symmetrically with respect to said axis,
   gas inlet means located symmetrically with respect to said axis at one of said opposite ends, and
   gas outlet means located symmetrically with respect to said axis at the other of said opposed ends.

2. Cathode sputtering system as in claim 1 comprising two said cathodes with associated targets located, on axially opposite sides of said substrate holding means.

3. Cathode sputtering system as in claim further comprising a masking located concentric to said axis between each said cathode and said casing, thereby creating an annular outer flow channel between each said masking and said casing.

4. Cathode sputtering system as in claim 3 wherein each said masking has open axially opposed ends, thereby creating an annular inner flow channel between each said masking and said flow channel.

5. Cathode sputtering system as in claim 3 wherein said gas inlet means comprises a ring manifold formed integrally with said masking.

6. Cathode sputtering system as in claim 1 wherein said gas inlet means comprises a bore hole through the center of each cathode and the associated target.

7. Cathode sputtering system as in claim 1 wherein said casing is cylindrical, said casing having a central axis which coincides with the axis of said substrate holding means.

8. Cathode sputtering system as in claim 1 wherein said gas inlet means comprises a ring manifold located between each target and said substrate holding means.

9. Cathode sputtering system as in claim 1 wherein at least one of said inlet means and said outlet means comprises a hole in said casing on said axis.

10. Cathode sputtering system as in claim 9 wherein both said inlet means and said outlet means comprise a hole in said casing on said axis.

11. Cathode sputtering system as in claim 1 wherein said casing has a circular cross section between said ends.

12. Cathode sputtering system as in claim 11 wherein said casing has a cylindrical shape.

* * * * *

UNITED STATES PATENT AND TRADEMARK OFFICE
CERTIFICATE OF CORRECTION

PATENT NO. : 5,228,968
DATED : July 20, 1993
INVENTOR(S) : Jaroslav Zejda

It is certified that error appears in the above-indentified patent and that said Letters Patent is hereby corrected as shown below:

Column 3, line 37: "il" should read --11--;
Column 4, line 18: "claim" should read --claim 1--.

Signed and Sealed this

Twentieth Day of September, 1994

Attest:

BRUCE LEHMAN

*Attesting Officer*  *Commissioner of Patents and Trademarks*